United States Patent
Tan et al.

(10) Patent No.: US 8,524,109 B2
(45) Date of Patent: Sep. 3, 2013

(54) HIGH CURIE TEMPERATURE TERNARY PIEZOELECTRIC CERAMICS

(75) Inventors: Xiaoli Tan, Ames, IA (US); Wei Hu, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 231 days.

(21) Appl. No.: 12/928,322

(22) Filed: Dec. 8, 2010

(65) Prior Publication Data

US 2012/0145943 A1 Jun. 14, 2012

(51) Int. Cl.
*H01L 41/187* (2006.01)

(52) U.S. Cl.
USPC .............. 252/62.9 PZ; 310/311; 501/126; 501/134

(58) Field of Classification Search
USPC .......... 252/62.9 PZ; 501/126, 134; 310/311
See application file for complete search history.

(56) References Cited

U.S. PATENT DOCUMENTS

| | | | |
|---|---|---|---|
| 2,486,560 A | 11/1949 | Gray et al. | 171/327 |
| 6,685,849 B2 | 2/2004 | Eitel et al. | 252/62.9 |

OTHER PUBLICATIONS

Choudhary et al, "Impedance Spectroscopic Studies of BiFeO3-Pb(ZrTi)O3 Nanocomposites", Modern Physics Letters B, vol. 23, No. 22 (Aug. 30, 2009), pp. 2655-2664.*
Choudhart et al, "Structural and electrical propeties of BiFeO3-Pb)ZrTi)O3 comosites", Applied Physics A, 86, 2007, pp. 131-138.*
Smith et al, "Dielectric Propeties of Soid Solutions of BiFeO3 with Pb(Ti,Zr)O3 at high Tempaerture and High Frequency", Joun. Appl. Physics, vol. 39, No. 1, Jan. 1968, pp. 70-74.*
Ikeda et al, "Piezoelectric Ceramics of Lead Zirconate-Titante Modifed by Bismuth Ferrite", Japan J. Appl. Phys. 2 (1963), pp. 63-64.*
Richard E. Eitel, et al., New High Temperature Morphotropic Phase Boundary Piezoelectrics Based on Bi(Me)O3-PbTiO3 Ceramics, Jpn. J. Appl. Phys. vol. 40, 2001, pp. 5999-6002.
Elena Aksel, et al., Advances in Lead-Free Piezoelectric Materials for Sensors and Actuators, Sensors 10, 2010, pp. 1935-1954.

* cited by examiner

*Primary Examiner* — Carol M Koslow

(57) ABSTRACT

A preferred piezoelectric ceramic material is a $BiFeO_3$—$PbZrO_3$—$PbTiO_3$ ternary solid solution wherein proportions of the constituent perovskite metal oxides are selected so that the material exhibits relatively high Curie temperatures above 380° C. and useful piezoelectric properties.

17 Claims, 4 Drawing Sheets

HIGH CURIE TEMPERATURE TERNARY PIEZOELECTRIC CERAMICS

CONTRACTUAL ORIGIN OF THE INVENTION

This invention was made with government support under Grant No. FA9550-08-1-0316 awarded by the Air Force Office of Scientific Research. The government has certain rights in the invention.

FIELD OF THE INVENTION

The present invention relates to a piezoelectric ceramic material comprising a series of ternary solid solution compositions of $BiFeO_3$, $PbZrO_3$, and $PbTiO_3$ in proportions to provide a beneficial combination of piezoelectric properties and Curie temperature.

BACKGROUND OF THE INVENTION

Piezoelectric ceramic materials are used in sensors, transducers, and actuators to convert energy between mechanical and electrical forms. Searching for ferroelectric ceramics with a higher Curie temperature has been a continuous task in the field of electroceramics due to the demand from high temperature piezoelectric applications.[1,2] The previous work reported in the literature was primarily focused on binary solid solution systems between two perovskite compounds,[2-4] such as $BiScO_3$—$PbTiO_3$,[5,6] $Bi(Mg_{1/2}Ti_{1/2})O_3$—$PbTiO_3$,[7,8] and $BiInO_3$—$PbTiO_3$.[9,10] In these binary systems, the dielectric and piezoelectric performances were observed to peak at the morphotropic phase boundary (MPB) composition where a composition-induced phase transition occurs.[11] The MPB composition, usually a very narrow composition range, displays a specific Curie temperature in the binary solid solution.

The $BiFeO_3$—$PbTiO_3$ (BF-PT) binary system exhibits a high Curie temperature (630° C.) and a large tetragonality at the MPB composition and has been investigated for high-temperature piezoelectric applications.[12-15] However, the high leakage current makes it difficult to pole the ceramic and the high coercive field leads to unsaturated hysteresis loops even at very high electric fields.[15-17] In the mean time, the well-known $PbZrO_3$—$PbTiO_3$ (PZT) ceramics have demonstrated excellent dielectric and piezoelectric performances but the Curie temperature at the MPB composition (380° C.) is low for some applications.[2,11] As a result of the relatively low Curie temperature, use of PZT-based devices has been restricted.

SUMMARY OF THE INVENTION

The present invention provides in an embodiment a piezoelectric ceramic material comprising a series of ternary solid solution compositions comprising $BiFeO_3$, $PbZrO_3$, and $PbTiO_3$ in proportions to provide a beneficial combination of piezoelectric properties and preferably increased Curie temperature as compared to that of PZT. The present invention includes, but is not limited to, morphotropic phase boundary compositions in the $BiFeO_3$—$PbZrO_3$—$PbTiO_3$ ternary solid solution system as base compositions to provide the combination of piezoelectric properties and increased Curie temperature. As a result, the ternary ceramic material provides compositional adjustability in the Curie temperature while maintaining the piezoelectric properties.

In an illustrative embodiment of the invention, the ceramic material comprises a $BiFeO_3$—$PbZrO_3$—$PbTiO_3$ ternary solid solution wherein the proportions of the perovskite metal oxides $BiFeO_3$, $PbZrO_3$, and $PbTiO_3$ are controlled to provide a ternary solid solution composition within the morphotropic phase boundary (MPB) region, providing a material preferably with relatively high Curie temperatures exceeding 380° C. and useful piezoelectric properties.

In a particular illustrative embodiment of the present invention, a ceramic material pursuant to the invention can be represented by the following:

$(1-x-y)BiFeO_3$-$xPbZrO_3$-$yPbTiO_3$.

MPB compositions of the ceramic material in this ternary solid solution system are listed in the following table, together with their Curie temperatures (Tc), coercive fields (Ec), and piezoelectric coefficients ($d_{33}$).

TABLE 1

Molar fractions for the MPB compositions and their properties.

| | MPB compositions | | | $T_C$ | $E_C$ | $d_{33}$ |
|---|---|---|---|---|---|---|
| | $BiFeO_3$ | $PbTiO_3$ | $PbZrO_3$ | (° C.) | (kV/cm) | (pC/N) |
| 1 | 0.648 | 0.299 | 0.053 | 575 | 28.9 | 64 |
| 2 | 0.566 | 0.329 | 0.105 | 495 | 25.1 | 64 |
| 3 | 0.506 | 0.333 | 0.161 | 440 | 32.2 | 90 |
| 4 | 0.445 | 0.335 | 0.220 | 395 | 38.3 | 119 |
| 5 | 0.372 | 0.351 | 0.277 | 360 | 44.7 | 139 |

The present invention envisions a sensor, transducer, or actuator made of the ternary ceramic material described above and advantageous in that it can be used in service applications where the temperature is above 150° C. Other advantages of the present invention will become apparent from the following drawings taken with the following detailed description of the invention.

DETAILED DESCRIPTION OF THE INVENTION

Figure 1:
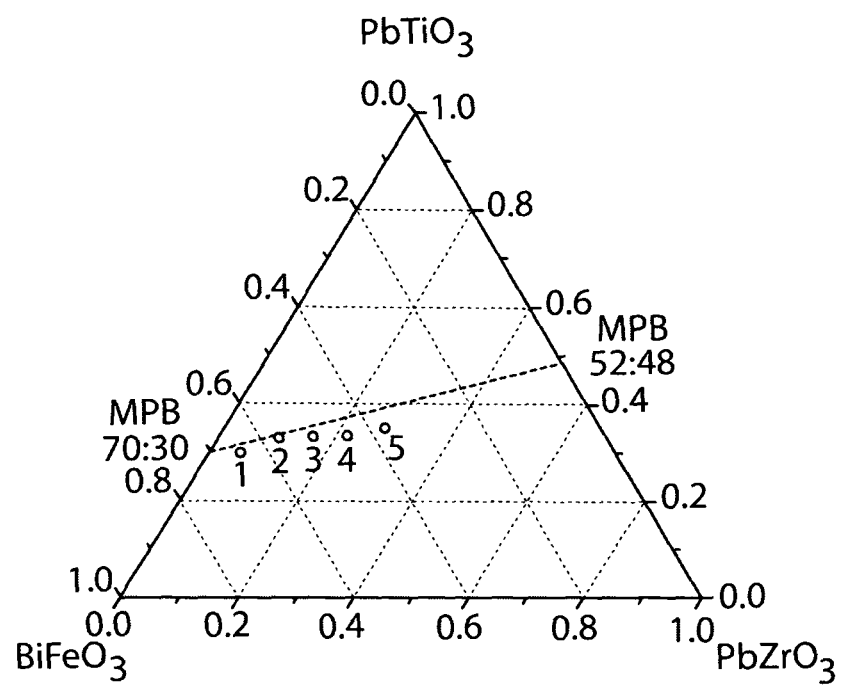
FIG. 1 shows the five MPB compositions (molar fractions) in the $BiFeO_3$—$PbZrO_3$—$PbTiO_3$ ternary phase diagram. It is apparent that these compositions deviate from the straight line connecting the two MPB compositions in binary $BiFeO_3$—$PbTiO_3$ and $PbZrO_3$—$PbTiO_3$ systems. In order to preserve the high Curie temperature, compositions close to the $BiFeO_3$—$PbTiO_3$ side are focused.

The present invention provides an illustrative embodiment a ceramic material comprising a ternary solid solution composition comprising perovskite metal oxides; namely, $BiFeO_3$, $PbZrO_3$, and $PbTiO_3$, wherein the proportions of $BiFeO_3$, $PbZrO_3$, and $PbTiO_3$ are selected and controlled to provide a material with a beneficial combination of comparable or preferably increased Curie temperature as compared to that of PZT as well as similar piezoelectric properties. The proportions of BiFeO$_3$, PbZrO$_3$, and PbTiO$_3$ can be selected to provide a ternary solid solution composition that falls within a morphotropic phase boundary (MPB) region. The MPB region comprises an area of the ternary phase diagram (at room temperature) of BiFeO$_3$, PbZrO$_3$, and PbTiO$_3$ between a tetragonal phase and a rhombohedral phase of the material. As a result, the ternary ceramic material provides compositional adjustability in the Curie temperature while maintaining piezoelectric properties comparable to those of PZT. For purposes of illustration and not limitation, a preferred ceramic material pursuant to the present invention can provide relatively high Curie temperatures exceeding 380° C., more generally in the range from 360 to 575° C., and piezoelectric properties similar to that of PZT. The present invention envisions a sensor, transducer, or actuator made of the preferred ternary ceramic material described above and advantageous in that it can be used in service applications where the temperature is above 150° C., the current limit for PZT material.

For purposes of further illustration and not limitation of the invention, a ceramic material pursuant to the invention can be represented by the following:

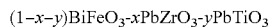

(1−x−y)BiFeO$_3$-xPbZrO$_3$-yPbTiO$_3$ where x is 0.02 to 0.28 while y is 0.26 to 0.36. As will become apparent below and as shown in Table 1 above, MPB ternary compositions of the ceramic material are provided when (1) x=0.053, y=0.299; (2) x=0.105, y=0.329; (3) x=0.161, y=0.333; (4) x=0.220, y=0.335; (5) x=0.277, y=0.351.

The ternary ceramic material pursuant to the present invention is advantageous in that it offers high perovskite phase formability, preferably a relatively high Curie temperature, a high dielectric permittivity, a low dielectric loss, and high ferroelectric and piezoelectric properties. Table 1 above illustrates that the MPB compositions 1, 2, 3, and 4 have a beneficial combination of piezoelectric properties and increased Curie temperature. Composition 5, although having a Curie temperature generally comparable to that of PZT, may nevertheless find uses in certain applications where its Curie temperature permits. The ternary ceramic material is sintered to develop and control its Curie temperature and electric properties and can be used in the form of a sintered ceramic body, film, and single crystals.

For purposes of illustration and not limitation, the ceramic material can be prepared using conventional solid state reaction using appropriate amounts of the oxide powders and/or carbonate powders, which are weighed out and intimately mixed. After drying, the mixed powder is pressed into a body and calcined in covered crucibles. Calcination is a solid state thermal process involving interdiffusion of cations and anions to achieve the ceramic material comprised of the ternary perovskite phases in solid solution, which can be determined by X-ray diffraction analysis. The as-calcined powder can be ground and milled in ethanol or other carrier liquid to reduce the particle size. Then, the dried slurry can be pressed to form cylindrical pellets with 10% poly vinyl alcohol (PVA) solution as binder and sintered at appropriate temperature(s) to develop the desired material structure and properties.

Applicants investigated the morphotropic phase boundary (MPB) compositions in the above-described ternary system. The content of PbTiO$_3$ was fine tuned in order to reach the appropriate volume fractions between the rhombohedral and tetragonal phases in the sintered ceramic material.

The processing conditions, especially the sintering temperature, were found to impact the rhombohedral phase/tetragonal phase ratio of the mixed-phase crystal structure of the sintered ceramics. It was further observed that the formation of impurity phase, ceramic density, grain morphology, dielectric as well as ferroelectric and piezoelectric properties are all very sensitive to the sintering temperature. Although the ceramics sintered at higher temperatures exhibit good dielectric properties with a sharp paraelectric/ferroelectric transition, the impurity phase along the grain boundary appears to be detrimental to the ferroelectric and piezoelectric properties.

The MPB compositions in this system deviate away from the straight line connecting the two MPB compositions in binary systems of BiFeO$_3$—PbTiO$_3$ and PbZrO$_3$—PbTiO$_3$, FIG. 1. To obtain ceramics with excellent piezoelectric performances and high Curie temperatures, the processing conditions can be adjusted to reduce or eliminate the impurity phase. In addition, additional minor amount dopants can be added.

EXAMPLES

Ceramic samples of the MPB compositions in the BiFeO$_3$—PbZrO$_3$—PbTiO$_3$ ternary system were prepared by the solid state reaction method.

Appropriate amounts of Bi$_2$O$_3$, Fe$_2$O$_3$, PbO, TiO$_2$, and ZrO$_2$ were mixed with vibratory mill in ethanol for 6 hours. After drying, the mixed powder was pressed and calcined in covered crucibles at 850° C. for 5 hours. The as-calcined powder was ground and milled in ethanol again for 15 h to reduce the particle size. Then the dried slurry was pressed at 300 MPa to form cylindrical pellets with 10% poly vinyl alcohol (PVA) solution as binder and sintered at temperatures 1075° C. for 2 hours. Protective powder of the same composition was placed around the pellets to minimize the loss of lead and bismuth.

The phase development after sintering was analyzed using X-ray diffractometer with Cu—Kα radiation. The Archimedes' method was employed to determine the density of sintered pellets. Scanning electron microscopy was used to examine the grain morphology in the as-sintered ceramics. For dielectric and ferroelectric measurements, sintered pellets were polished and electroded with silver paste. An LCR meter (HP-4284A, Hewlett-Packard) in conjunction with a high temperature sample holder cell system (ProboStat, NorECs) was used to measure the temperature dependence of dielectric constant and loss tangent during heating from room temperature to 700° C. The polarization v.s. electric field hysteretic loops were characterized by the RT-66A standardized ferroelectric test system (Radiant Technologies). For piezoelectric measurements, the ceramic was poled at room temperature at 70 kV/cm for 1 hour. Piezoelectric coefficient d$_{33}$ was measured 24 hours after poling with a piezo-d$_{33}$ meter (ZJ-4B, Shanghai Institute of Ceramics).

Figure 2:
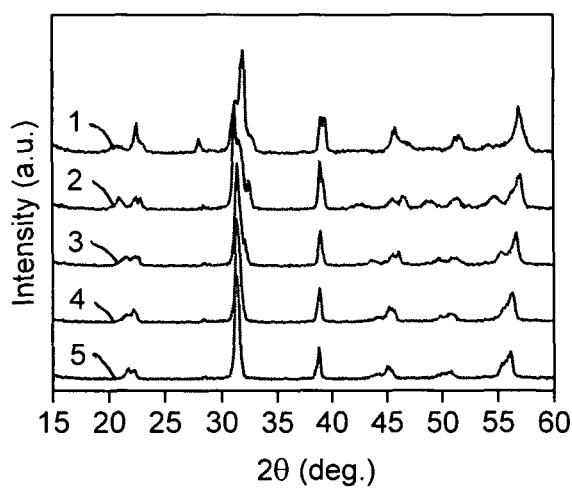
FIG. 2 displays X-ray diffraction data showing phase formation in the ceramics sintered at 1075° C. for two hours. The diffraction spectra confirmed all five compositions are at the morphotropic phase boundary with a mixture of tetragonal and rhombohedral phases.
Figure 3:
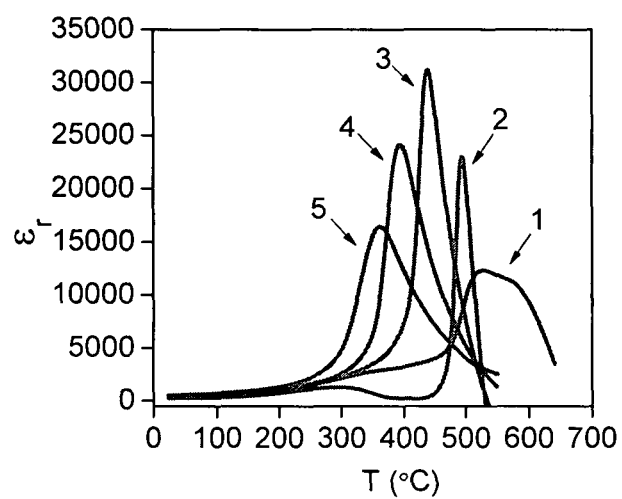
FIG. 3 shows the temperature dependence of dielectric constant $\in_r$ measured at 100 kHz during heating for the five MPB compositions. The temperature where the dielectric constant peaks is the Curie temperature.
Figure 4:
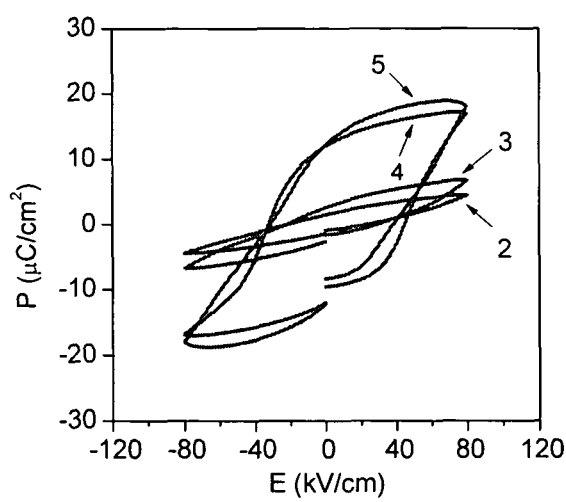
FIG. 4 illustrate the polarization vs. electric field hysteresis loops measured at room temperature at 4 Hz in these MPB compositions.

For these example MPB compositions, the crystal structure, dielectric and ferroelectric properties are displayed in FIGS. 2 through 4, while the composition, Curie temperature, coercive field, and piezoelectric coefficient are listed in Table 1 above.

Although the present invention has been described in detail with respect to certain illustrative embodiments thereof, those skilled in the art will appreciate that changes and modifications can be made therein within the scope of the invention as set forth in the appended claims.

References which are incorporated herein by reference:
1. Damjanovic D. Materials for high temperature piezoelectric transducers. *Curr Opin Solid St Mat Sci* 1998; 3:469-73.

2. Eitel R E, Randall C A, Shrout T R, Rehrig P W, Hackenberger W, Park S E. New high temperature morphotropic phase boundary piezoelectrics based on Bi(Me)O$_3$—PbTiO$_3$ ceramics. *Jpn J Appl Phys* 2001; 40:5999-6002.
3. Stringer C J, Shrout T R, Randall C A, Reaney I M. Classification of transition temperature behavior in ferroelectric PbTiO$_3$—Bi(Me'Me")O$_3$ solid solutions. *J Appl Phys* 2006; 99:024106.
4. Grinberg I, Suchomel M R, Davies P K, Rappe A M. Predicting morphotropic phase boundary locations and transition temperatures in Pb- and Bi-based perovskite solid solutions from crystal chemical data and first-principles calculations. *J Appl Phys* 2005; 98:094111.
5. Eitel R E, Randall C A, Shrout T R, Park S E. Preparation and characterization of high temperature perovskite ferroelectrics in the solid-solution (1-x)BiScO$_3$-xPbTiO$_3$. *Jpn J Appl Phys* 2002; 41:2099-104.
6. Zhang S J, Randall C A, Shrout T R. High Curie temperature piezocrystals in the BiScO$_3$—PbTiO$_3$ perovskite system. *Appl Phys Lett* 2003; 83:3150-2.
7. Randall C A, Eitel R, Jones B, Shrout T R, Woodward D I, Reaney I M. Investigation of a high $T_C$ piezoelectric system: (1-x)Bi(Mg$_{1/2}$Ti$_{1/2}$)O$_3$-(x)PbTiO$_3$. J Appl Phys 2004; 95:3633-9.
8. Chen J, Tan X L, Jo W, Rodel J. Temperature dependence of piezoelectric properties of high-$T_C$ Bi(Mg$_{1/2}$Ti$_{1/2}$)O$_3$—PbTiO$_3$. *J Appl Phys* 2009; 106:034109.
9. Duan R R, Speyer R F, Alberta E, Shrout T R. High curie temperature perovskite BiInO$_3$—PbTiO$_3$ ceramics. *J Mater Res* 2004; 19:2185-93.
10. Zhang S J, Xia R, Randall C A, Shrout T R, Duan R R, Speyer R F. Dielectric and piezoelectric properties of niobium-modified BiInO$_3$—PbTiO$_3$ perovskite ceramics with high Curie temperatures. *J Mater Res* 2005; 20:2067-71.
11. Jaffe B, Cook W R, Jaffe H. Piezoelectric Ceramics. London and New York: Academic Press; 1971.
12. Sunder VVSSS, Halliyal A, Umarji A M. Investigation of tetragonal distortion in the PbTiO$_3$—BiFeO$_3$ system by high-temperature X-ray diffraction. *J Mater Res* 1995; 10:1301-6.
13. Zhu W M, Ye Z G. Effects of chemical modification on the electrical properties of 0.67BiFeO$_3$-0.33PbTiO$_3$ ferroelectric ceramics. *Ceram Int* 2004; 30:1435-42.
14. Zhu W M, Guo H Y, Ye Z G. Structural and magnetic characterization of multiferroic (BiFeO$_3$)$_{1-x}$(PbTiO3)$_x$ solid solutions. *Phys Rev B* 2008; 78:014401.
15. Comyn T P, McBride S P, Bell A J. Processing and electrical properties of BiFeO$_3$—PbTiO$_3$ ceramics. *Mater Lett* 2004; 30:3844-6.
16. Catalan G, Scott J F. Physics and applications of bismuth ferrite. *Adv Mater* 2009; 21:2463-85.
17. Qi X D, Dho J, Tomov R, Blamire M G, MacManus-Driscoll J L. Greatly reduced leakage current and conduction mechanism in aliovalent-ion-doped BiFeO$_3$. *Appl Phys Lett* 2005; 86:062903.

The invention claimed is:
1. A ceramic material comprising a ternary solid solution composition of BiFeO$_3$—PbZrO$_3$—PbTiO$_3$ represented by the following:
 (1−x−y)BiFeO$_3$-xPbZrO$_3$-yPbTiO$_3$ where x is 0.02 to 0.28 while y is 0.26 to 0.36 and where x and y have different values and are selected such that the composition resides in a morphotropic phase boundary (MPB) region and the BiFeO$_3$ is present in a molar fraction greater than 50%.
2. The material of claim 1 wherein x is 0.053 and y is 0.299.
3. The material of claim 1 wherein x is 0.105 and y is 0.329.
4. The material of claim 1 wherein x is 0.161 and y is 0.333.
5. The material of claim 1 which is sintered.
6. A ceramic material comprising a ternary solid solution composition with BiFeO$_3$, PbZrO$_3$, and PbTiO$_3$ in proportions to provide a combination of piezoelectric properties and increased Curie temperature as compared to that of PZT wherein the proportions of PbZrO$_3$, and PbTiO$_3$ are different, wherein the molar fraction of BiFeO$_3$ is greater than 50%, and wherein the composition resides within a morphotropic phase boundary (MPB) region.
7. The material of claim 6 having a Curie temperature exceeding 440° C.
8. The material of claim 7 wherein the Curie temperature is up to 575° C.
9. The material of claim 6 which is sintered.
10. A sensor, transducer, or actuator made of the material of claim 1.
11. A sensor, transducer, or actuator made of the material of claim 6.
12. A method of making a piezoelectric ceramic material, comprising mixing proportions of BiFeO$_3$, PbZrO$_3$, PbTiO$_3$, calcining the mixture to make a ternary solid solution composition comprising BiFeO$_3$, PbZrO$_3$, and PbTiO$_3$ including selecting proportions of the BiFeO$_3$, PbZrO$_3$, and PbTiO$_3$ wherein the proportions of PbZrO$_3$, and PbTiO$_3$ are different and wherein a molar fraction of BiFeO$_3$ is greater than 50% such that the ternary solid solution composition resides within a morphotropic phase boundary (MPB) region with a Curie temperature comparable to or increased as compared to that of PZT.
13. The method of claim 12 wherein the ceramic material is represented by the following:
 (1−x−y)BiFeO$_3$-xPbZrO$_3$-yPbTiO$_3$ where x is 0.02 to 0.28 while y is 0.26 to 0.36 and wherein x and y have different values.
14. The method of claim 13 wherein x is 0.053 and y is 0.299.
15. The method of claim 13 wherein x is 0.105 and y is 0.329.
16. The method of claim 13 wherein x is 0.161 and y is 0.333.
17. The method of claim 12 including sintering the material.

* * * * *